United States Patent
Nakamura

(10) Patent No.: US 10,886,202 B2
(45) Date of Patent: Jan. 5, 2021

(54) SEMICONDUCTOR DEVICE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 103 days.

(21) Appl. No.: 15/408,830

(22) Filed: Jan. 18, 2017

(65) Prior Publication Data

US 2017/0358522 A1    Dec. 14, 2017

(30) Foreign Application Priority Data

Jun. 10, 2016    (JP) ................................. 2016-115994

(51) Int. Cl.
*H01L 23/495*    (2006.01)
*H02M 7/00*    (2006.01)
(Continued)

(52) U.S. Cl.
CPC ...... *H01L 23/49548* (2013.01); *H01L 23/495* (2013.01); *H01L 23/4952* (2013.01);
(Continued)

(58) Field of Classification Search
CPC ............... H01L 23/4952; H01L 23/495; H01L 23/49548; H02M 7/5387
See application file for complete search history.

(56) References Cited

U.S. PATENT DOCUMENTS 5,747,875 A * 5/1998 Oshima ................... H01L 25/16
257/687
6,933,593 B2    8/2005 Fissore et al.
(Continued)

FOREIGN PATENT DOCUMENTS

CN    1836328 A    9/2006
CN    101834176 A    9/2010
(Continued)

OTHER PUBLICATIONS

An Office Action mailed by the German Patent Office dated Nov. 11, 2019, which corresponds to German Patent Application No. 10 2017 209 292.0 and is related to U.S. Appl. No. 15/408,830.
(Continued)

*Primary Examiner* — Jose R Diaz
(74) *Attorney, Agent, or Firm* — Studebaker & Brackett PC

(57) ABSTRACT

Provided is a semiconductor device capable of having simple wiring in mounting the semiconductor device. The semiconductor device includes at least one P-terminal, at least one N-terminal, a power output terminal, at least one power supply terminal, at least one ground (GND) terminal, at least one control terminal, and a package that is rectangular in a plan view and accommodates an insulated gate bipolar transistor (IGBT) being a high-side switching element, an IGBT being a low-side switching element, and a control circuit. The at least one control terminal is disposed on a first side of the package, opposite to a second side on which the power output terminal is disposed. The at least one P-terminal, the at least one N-terminal, the at least one power supply terminal, and the at least one GND terminal are disposed on a third side of the package, orthogonal to the second side.

4 Claims, 7 Drawing Sheets

(51) Int. Cl.
*H02M 7/5387* (2007.01)
*H02M 7/537* (2006.01)

(52) U.S. Cl.
CPC .. *H01L 23/49531* (2013.01); *H01L 23/49568* (2013.01); *H01L 23/49575* (2013.01); *H02M 7/003* (2013.01); *H02M 7/537* (2013.01); *H02M 7/5387* (2013.01); *H01L 23/49503* (2013.01); *H01L 23/49524* (2013.01); *H01L 23/49555* (2013.01); *H01L 23/49562* (2013.01); *H01L 2224/0603* (2013.01); *H01L 2224/48137* (2013.01); *H01L 2224/48139* (2013.01); *H01L 2224/48247* (2013.01); *H01L 2224/49111* (2013.01); *H01L 2224/49113* (2013.01); *H01L 2224/49175* (2013.01); *H01L 2924/181* (2013.01)

(56) References Cited

U.S. PATENT DOCUMENTS

| | | | | |
|---|---|---|---|---|
| 8,120,153 | B1* | 2/2012 | Shen | H01L 21/565 |
| | | | | 257/677 |
| 9,059,128 | B2* | 6/2015 | Murata | H01L 23/4334 |
| 9,136,193 | B2* | 9/2015 | Minamio | H01L 23/36 |
| 2005/0035434 | A1* | 2/2005 | Fissore | H01L 23/49861 |
| | | | | 257/666 |
| 2014/0361648 | A1* | 12/2014 | Shirakata | H02K 11/046 |
| | | | | 310/52 |
| 2015/0303126 | A1* | 10/2015 | Takahashi | H01L 23/10 |
| | | | | 257/77 |
| 2015/0326217 | A1* | 11/2015 | Barrenscheen | H03K 17/165 |
| | | | | 327/543 |

FOREIGN PATENT DOCUMENTS

| | | |
|---|---|---|
| DE | 4418426 A1 | 11/1995 |
| JP | 2007-502544 A | 2/2007 |
| WO | 2005/017970 A2 | 2/2005 |

OTHER PUBLICATIONS

An Office Action mailed by the State Intellectual Property Office of the People's Republic of China dated Aug. 20, 2019, which corresponds to Chinese Patent Application No. 201710433694.1 and is related to U.S. Appl. No. 15/408,830; with English translation.

An Office Action mailed by the State Intellectual Property Office of the People's Republic of China on Apr. 9, 2020, which corresponds to Chinese Patent Application No. 201710433694.1 and is related to U.S. Appl. No. 15/408,830 with English language translation.

An Office Action mailed by the State Intellectual Property Office of the People's Republic of China dated Sep. 25, 2020, which corresponds to Chinese Patent Application No. 201710433694.1 and is related to U.S. Appl. No. 15/408,830; with English language translation.

* cited by examiner

SEMICONDUCTOR DEVICE

BACKGROUND OF THE INVENTION

Field of the Invention

The present invention relates to power semiconductor devices.

Description of the Background Art

A conventional DIPIPM (registered trademark) includes an insulated gate bipolar transistor (IGBT) with a three-phase full bridge, a free wheeling diode (FWD), and a control circuit. Output terminals (U, V, W) are disposed between terminals used to pass a main current, i.e., between an input P-terminal that is a main terminal and an input N-terminal that is a main terminal. The control circuit includes multiple power supply terminals. On a substrate of an inverter, a three-phase AC power supply is connected to the P-terminal and N-terminal of the DIPIPM through a diode bridge and a smoothing capacitor. A power supply of the control circuit is separately supplied through a device such as a transformer. The DIPIPM functions to protect against a short circuit, and is capable of protecting the IGBT by detecting a voltage across a shunt resistor through which the control circuit is connected to the N-terminal.

The main terminals and the terminals of the control circuit are conventionally disposed on sides of a package, opposite to each other. Hence, in main-terminal sides, a wire connected to the P-terminal, a wire connected to the N-terminal through the shunt resistor, and an output wire intersect with each other; and in the terminals of a control-circuit side, a power supply wire and a ground (GND) wire intersect with each other.

Further, in the control circuit, the wire from the N-terminal is connected to a terminal for detecting and protecting against the short circuit. As such, the wires, which run from the main-terminal sides to the terminals of the control-circuit side, are complicated. Hence, if a module has a high current-capacity, it is difficult to have a sufficient cross-section area of a wire pattern on the substrate. This results in the need for a multi-layer substrate or a wiring material such as a jumper wire.

For instance, Japanese Unexamined Patent Application Publication (Translation of PCT Application) No. 2007-502544 discloses a module on which a power semiconductor device is mounted. This module is configured such that an output lead and a pin lead are disposed on sides of a mold body, opposite to each other. The module is also configured such that a power input lead (corresponding to the P-terminal) and a ground lead (corresponding to the N-terminal) are disposed on a side of the mold body, orthogonal to the side on which the output lead is disposed. Such a configuration prevents the wire connected to the P-terminal, the wire connected to the N-terminal, and the output wire from intersecting with each other.

However, the module of Japanese Unexamined Patent Application Publication (Translation of PCT Application) No. 2007-502544 does not include a control circuit. Japanese Unexamined Patent Application Publication (Translation of PCT Application) No. 2007-502544 fails to disclose a positional relationship between the power supply terminal of the control circuit and the GND terminal. Thus, the use of the technique of Japanese Unexamined Patent Application Publication (Translation of PCT Application) No. 2007-502544 in the conventional DIPIPM would not eliminate the intersection of the power supply wire and GND wire in the terminals of the control circuit. Simple wiring is thus difficult in mounting the module.

SUMMARY OF THE INVENTION

It is an object of the present invention to provide a semiconductor device capable of having simple wiring in mounting the semiconductor device.

The semiconductor device according to an aspect of the present invention has a half-bridge configuration. The semiconductor device includes at least one P-terminal, at least one N-terminal, a power output terminal, at least one power supply terminal, at least one ground (GND) terminal, at least one control terminal, and a package that is rectangular in a plan view. The at least one P-terminal is connected to a high-side end of a half bridge. The at least one N-terminal is connected to a low-side end of the half bridge. The power output terminal is connected to a connection point between a high-side switching element of the half bridge and a low-side switching element of the half bridge. Each of the at least one power supply terminal and the at least one GND terminal is connected to a control circuit configured to control the high-side switching element and the low-side switching element. Through the at least one control terminal, the control circuit is configured to control the high-side switching element and the low-side switching element. The package accommodates the high-side switching element, the low-side switching element, and the control circuit. The at least one control terminal is disposed on a first side of the package, opposite to a second side on which the power output terminal is disposed. The at least one P-terminal, the at least one N-terminal, the at least one power supply terminal, and the at least one GND terminal are disposed on a third side of the package, orthogonal to the second side.

The at least one control terminal is disposed on the first side of the package, opposite to the second side. Such a configuration prevents a wire connected to the at least one control terminal and a wire connected to the power output terminal from intersecting with each other. The at least one P-terminal, the at least one N-terminal, the at least one power supply terminal, and the at least one GND terminal are disposed on the third side of the package, orthogonal to the second side. Such a configuration enables a plurality of semiconductor devices to be connected to each other so as to be adjacent to the third side, when the semiconductor devices have a full-bridge configuration. As a result, wires connected to the at least one P-terminal, the at least one N-terminal, the at least one power supply terminal, and the at least one GND terminal are partially incorporated within the package. This provides simple wiring in mounting the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
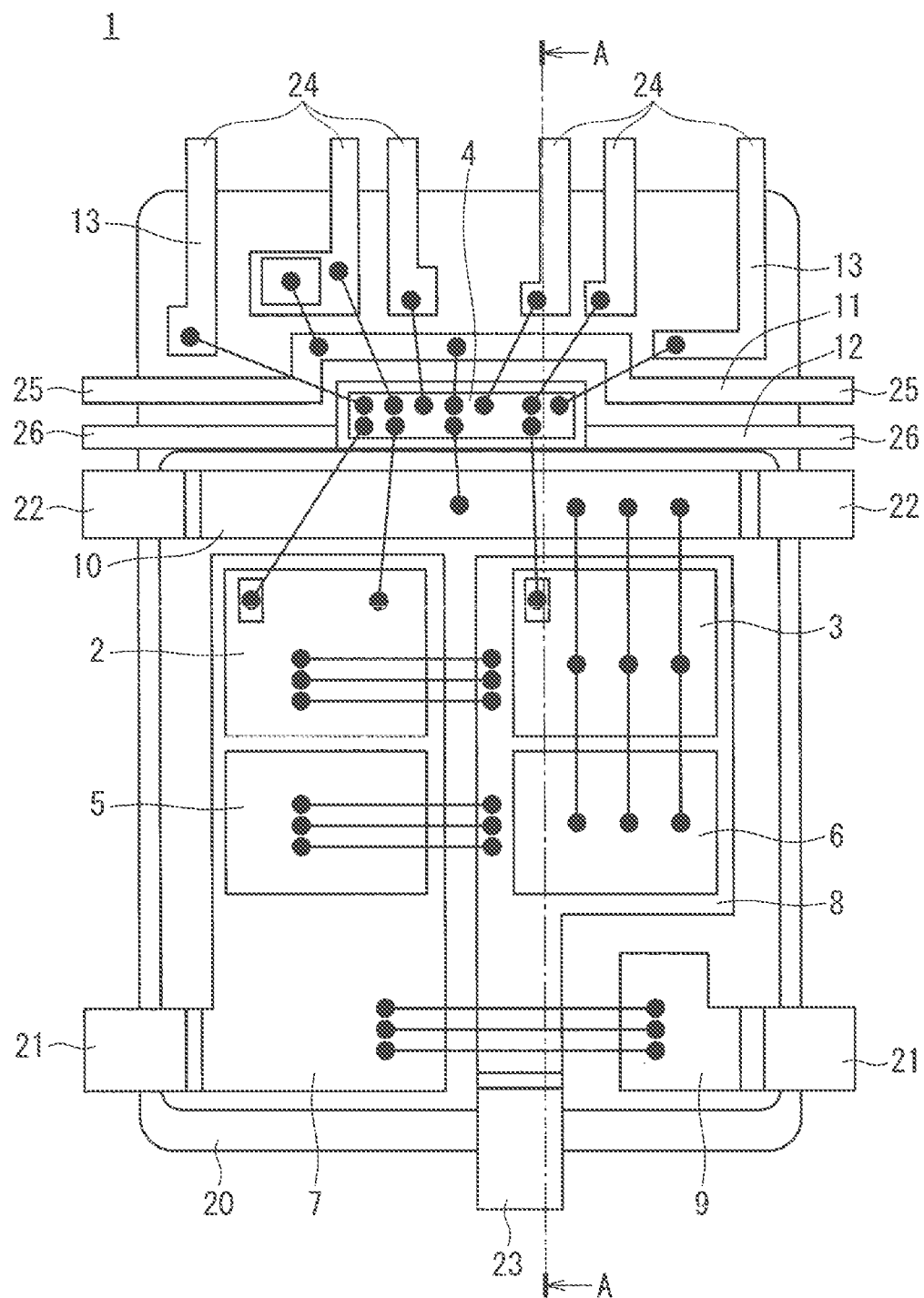
FIG. 1 is a perspective plan view of a semiconductor device according to a first preferred embodiment.
Figure 2:
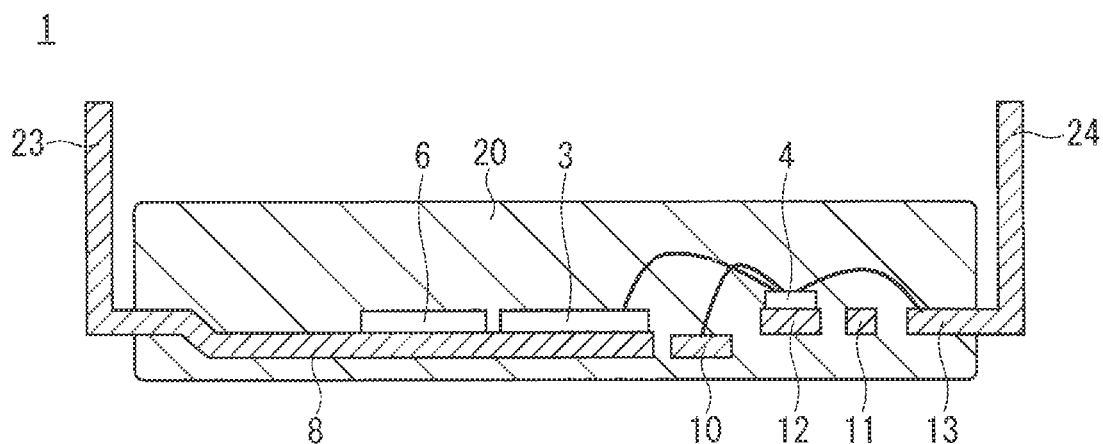
FIG. 2 is a cross-sectional view taken along line A-A in FIG. 1.
Figure 3:
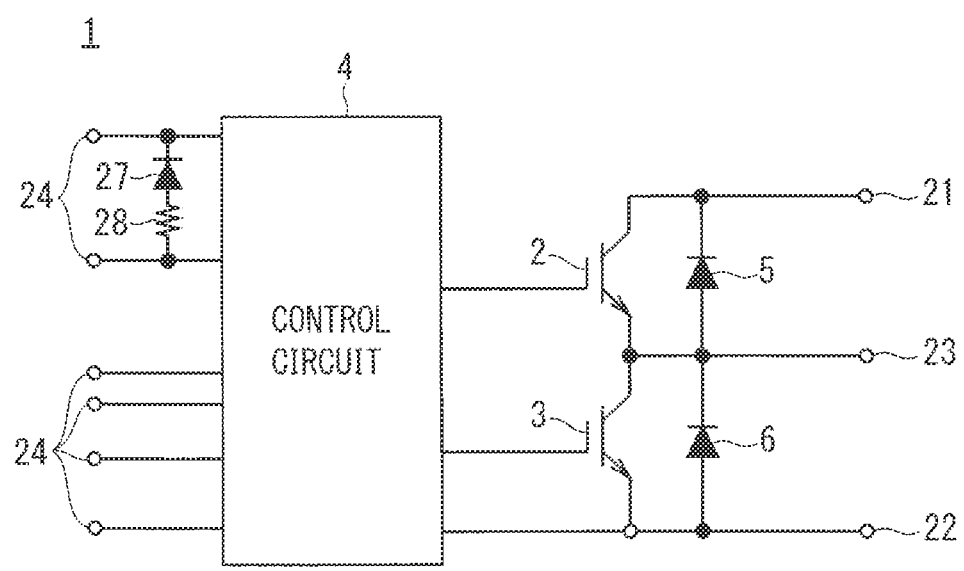
FIG. 3 is a circuit diagram of the semiconductor device according to the first preferred embodiment.

The following describes a first preferred embodiment of the present invention with reference to the drawings. FIG. 1 is a perspective plan view of a semiconductor device 1 according to the first preferred embodiment. FIG. 2 is a cross-sectional view taken along line A-A in FIG. 1. FIG. 3 is a circuit diagram of the semiconductor device 1.

As illustrated in FIGS. 1 and 2, the semiconductor device 1 is a transfer-molded power module. The semiconductor device 1 includes an insulated gate bipolar transistor (IGBT) 2, an IGBT 3, a control circuit 4, free wheeling diodes (FWDs) 5 and 6, lead frames 7 to 13, P-terminals 21, N-terminals 22, a power output terminal 23, control terminals 24, power supply terminals 25, ground (GND) terminals 26, and a package 20. The IGBT 2 is a high-side switching element. The IGBT 3 is a low-side switching element.

Each of the lead frames 7 to 13 is a processed metal thin plate into a wire shape. The IGBT 2 is mounted on an upper surface of the lead frame 7. The lead frame 7 is a first lead frame. The IGBT 3 is mounted on an upper surface of the lead frame 8, and is connected in series to the IGBT 2 through an internal wire. The lead frame 8 is a second lead frame. The control circuit 4 is mounted on an upper surface of the lead frame 12. The control circuit 4 is connected to the gates of the IGBT 2 and IGBT 3 through internal wires, and controls switching operations of the IGBT 2 and IGBT 3. The control circuit 4 is also connected to the N-terminals 22 through an internal wire, and detects overcurrents of the IGBT 2 and IGBT 3 in response to an input from the N-terminals 22, to protect against a short circuit.

As illustrated in FIGS. 1, 2 and 3, the respective P-terminals 21 are disposed on one end of the lead frame 7 and one end of the lead frame 9. The P-terminals are connected to a collector of the IGBT 2 through an internal wire. This collector is a high-side end of a half bridge. The N-terminals 22 are disposed on both ends of the lead frame 10, and are connected to an emitter of the IGBT 3 through an internal wire. This emitter is a low-side end of the half bridge. The power output terminal 23 is disposed on one end of the lead frame 8 and is connected to a connection point between the IGBT 2 and the IGBT 3, more specifically to a connection point between an emitter of the IGBT 2 and a collector of the IGBT 3, through an internal wire.

The FWD 5 is mounted on the upper surface of the lead frame 7. The FWD 5 is connected between the emitter and collector of the IGBT 2, where the emitter is near an anode of the FWD 5. The FWD 5 passes a back-flow current while the IGBT 2 is turned off. The FWD 6 is mounted on the upper surface of the lead frame 8. The FWD 6 is connected between the collector and emitter of the IGBT 3, where the emitter is near an anode of the FWD 6. The FWD 6 passes a back-flow current while the IGBT 3 is turned off.

Through the control terminals 24, the control circuit 4 controls the IGBT 2 and the IGBT 3. Each of the control terminals 24 is disposed on one end of the lead frame 13, and is connected to the control circuit 4 through an internal wire. The semiconductor device 1 includes six control terminals 24, and is configured such that a bootstrap diode (BSD) 27 and a resistor 28 are connected between two of the control terminals 24. The power supply terminals 25 are disposed on both ends of the lead frame 11, and are connected to the control circuit 4 through an internal wire. The GND terminals 26 are disposed on both sides of the lead frame 12, and are connected to the control circuit 4 through an internal wire.

The package 20 is made of a molding resin and is rectangular in a plan view. The package 20 seals and accommodates the IGBTs 2 and 3, the control circuit 4, the FWDs 5 and 6, and the lead frames 7 to 13 except where the terminals are disposed.

The following describes a positional relationship of the individual terminals in the semiconductor device 1, by referring to FIG. 1. The power output terminal 23 is disposed on the lower side of the package 20 in FIG. 1. The control terminals 24 are disposed on the upper side of the package 20 in FIG. 1; that is, the control terminals 24 are disposed on a side of the package 20, opposite to the lower side, on which the power output terminal 23 is disposed. The P-terminals 21, the N-terminals 22, the power supply terminals 25, and the GND terminals 26 are disposed on the left and right sides of the package 20 in FIG. 1; that is, these terminals are disposed on sides of the package 20, orthogonal to the lower side, on which the power output terminal 23 is disposed. The P-terminals 21, the N-terminals 22, and the power output terminal 23 are main terminals.

Figure 4:
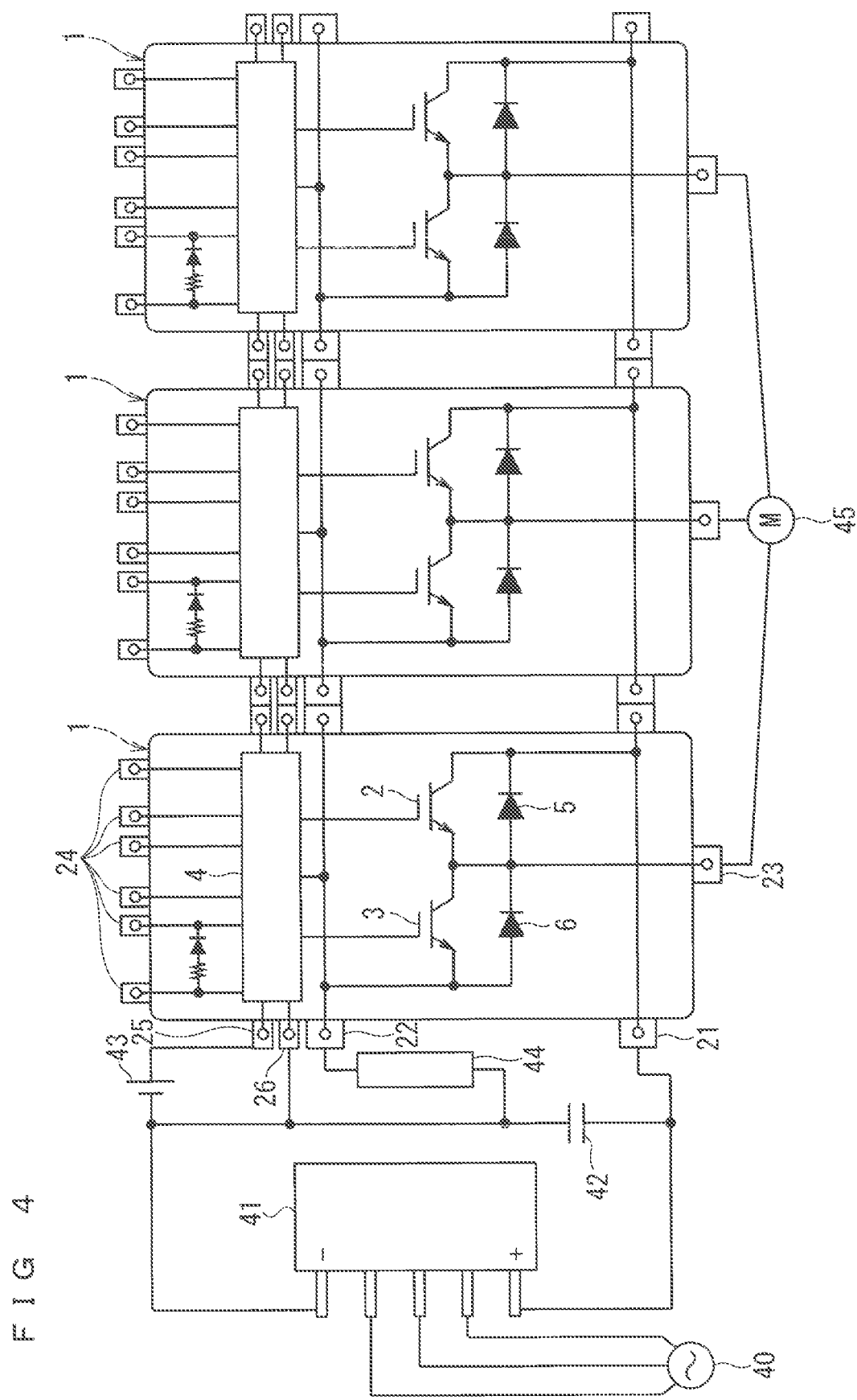
FIG. 4 is a circuit diagram of an exemplary configuration of a three-phase inverter of the semiconductor device according to the first preferred embodiment.

The following describes an exemplary configuration of a three-phase inverter of the semiconductor device 1. FIG. 4 is a circuit diagram of the exemplary configuration of the three-phase inverter of the semiconductor device 1.

As illustrated in FIG. 4, the semiconductor device 1 has a half-bridge configuration. Thus, in order for the semiconductor device 1 to have a full-bridge configuration, it is assumed that three semiconductor devices 1 are aligned, and that for use, the P-terminals 21 of the adjacent semiconductor devices 1 are connected to each other, the N-terminals 22 of the adjacent semiconductor devices 1 are connected to each other, the power supply terminals 25 of the adjacent semiconductor devices 1 are connected to each other, and the GND terminals 26 of the adjacent semiconductor devices 1 are connected to each other. A three-phase AC power supply 40 is connected to the P-terminals 21 through a diode bridge 41 and a smoothing capacitor 42. The three-phase AC power supply 40 also is connected to the N-terminals 22 through the diode bridge 41, the smoothing capacitor 42 and a shunt resistor 44. While the three-phase inverter operates, the three-phase AC power supply 40 applies a DC power supply voltage between the P-terminals 21 and the N-terminals 22 through the diode bridge 41 and the smoothing capacitor 42. A DC power supply 43 is connected to the power supply terminals 25. A motor 45 is connected to the power output terminals 23.

FIG. 4 illustrates one example of the three-phase inverter. In a two-phase inverter, two semiconductor devices 1, each having a half-bridge configuration, are connected to each other. Further, a required number of semiconductor devices 1, each having a half-bridge configuration, are added to the configuration illustrated in FIG. 4, in forming multiple inverters that operates with a single power supply.

Figure 8:
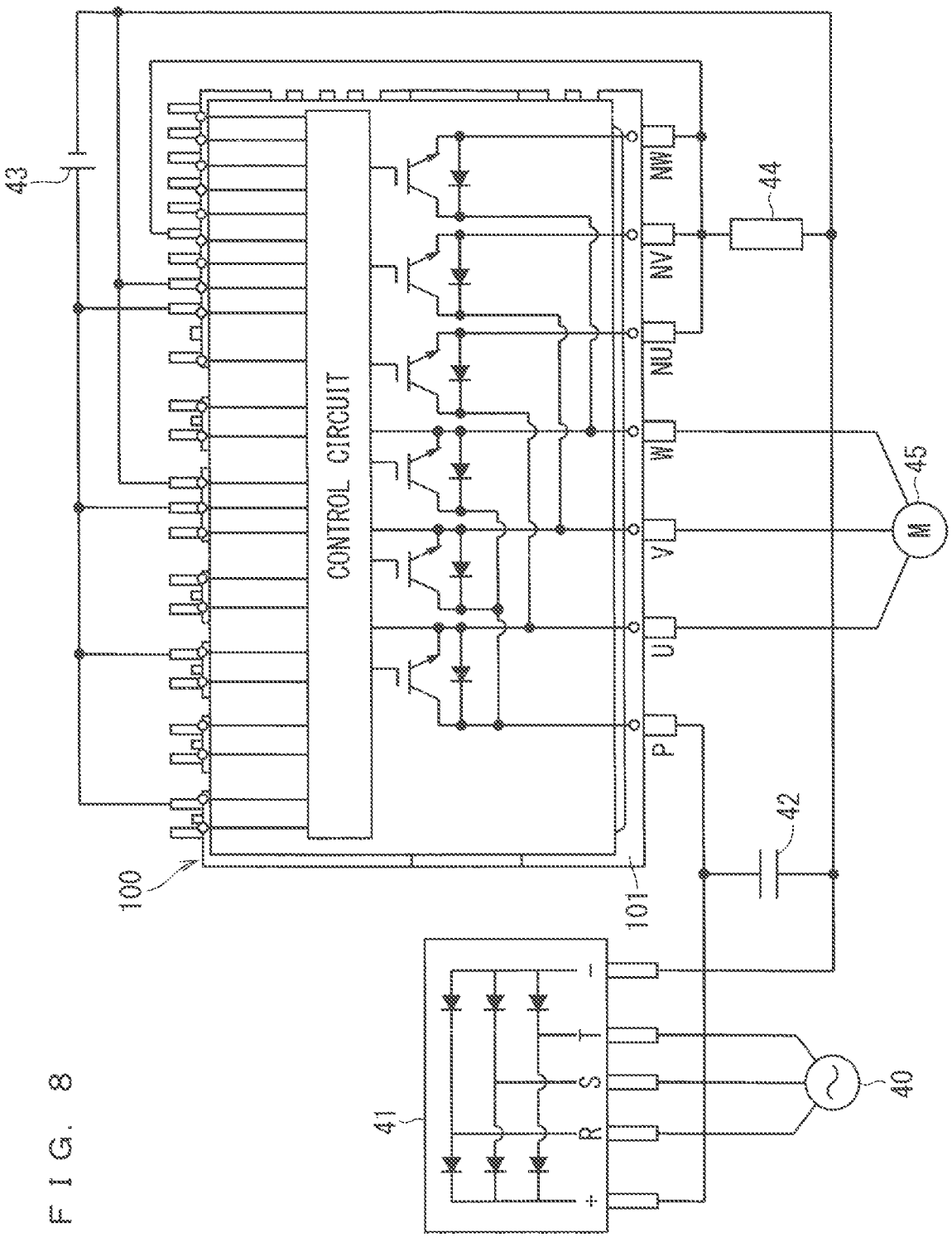
FIG. 8 is a circuit diagram of an exemplary configuration of a three-phase inverter of a semiconductor device according to a fundamental technique.

The following describes an advantage obtained by virtue of the semiconductor device 1 according to the first preferred embodiment, by referring to a comparison with a semiconductor device according to a fundamental technique. FIG. 8 is a circuit diagram of an exemplary configuration of a three-phase inverter of the semiconductor device according to the fundamental technique.

First of all, reference is made to a three-phase inverter 100 that includes the semiconductor devices according to the fundamental technique. As illustrated in FIG. 8, the three-phase inverter 100 is configured such that main terminals and terminals of a control circuit are disposed on sides of a package 101, opposite to each other. Thus, wires connected to P-terminals, wires connected to N-terminals through a shunt resistor, and an output wire intersect with each other in main-terminal sides. Further, a power supply wire and a GND wire intersect with each other in the terminals of a control-circuit side. Still further, the wires from the N-terminals are connected to terminals for detecting and protecting against a short circuit, in the control circuit. As such, the wires, which run from the main-terminal sides through the terminals of the control-circuit side, are complicated. Hence, if the three-phase inverter 100 has a high current-capacity, it is difficult to have a sufficient cross-section area of a wire pattern on a substrate. This results in the need for a multi-layer substrate or a wiring material such as a jumper wire.

In contrast, as illustrated in FIG. 4, the semiconductor device 1 according to the first preferred embodiment is configured such that control terminals 24 are disposed on the side of the package 20, opposite to the lower side, on which the power output terminal 23 is disposed. Such a configuration prevents the wires connected to the control terminals 24 and the wire connected to the power output terminal 23 from intersecting with each other. Further, the semiconductor device 1 is configured such that the P-terminals 21, the N-terminals 22, the power supply terminals 25, and the GND terminals 26 are disposed on the side of the package 20, orthogonal to the lower side, on which the power output terminal 23 is disposed. Such a configuration enables a plurality of semiconductor devices 1 to be connected to each other so as to be adjacent to the side on which the P-terminals 21, the N-terminals 22, the power supply terminals 25, and the GND terminal 26 are disposed, when the semiconductor devices 1 have the full-bridge configuration. As a result, the wires connected to the P-terminals 21, N-terminals 22, power supply terminals 25, and GND terminals 26 are partially incorporated within the package 20. This provides simple wiring in mounting the semiconductor device 1. Consequently, the area of a substrate is effectively used.

The control circuit 4 is connected to the N-terminals 22 the through the internal wire. The control circuit 4 further detects the overcurrents of the IGBT 2 and IGBT 3 in response to the input from the N-terminals 22, to thus protect against the short circuit. Such a configuration enables short-circuit protection for multiple phases, if a plurality of semiconductor devices 1 are connected to each other to form a multi-phase inverter.

In the fundamental technique, the N-terminals and the terminal of the control circuit, for detecting and protecting against the short circuit, are connected to each other through an external wire, as described above. Thus, the wires run from the main-terminal sides through the terminals of the control-circuit side. This causes complicated wiring. The control circuit 4 is connected to the N-terminals 22 through the internal wire. This eliminates the need for the external wire, which is used to connect the N-terminals 22 and the terminal for detecting and protecting against a short circuit. Consequently, simple wiring in mounting the semiconductor device 1 is provided.

The P-terminals 21, the N-terminals 22, the power supply terminals 25, and the GND terminals 26 are disposed on the same side of the package 20. Such a configuration prevents the wires from the three-phase AC power supply 40, connected to the P-terminals 21, N-terminals 22, power supply terminals 25, and GND terminals 26 from intersecting with each other.

Second Preferred Embodiment

Figure 5:
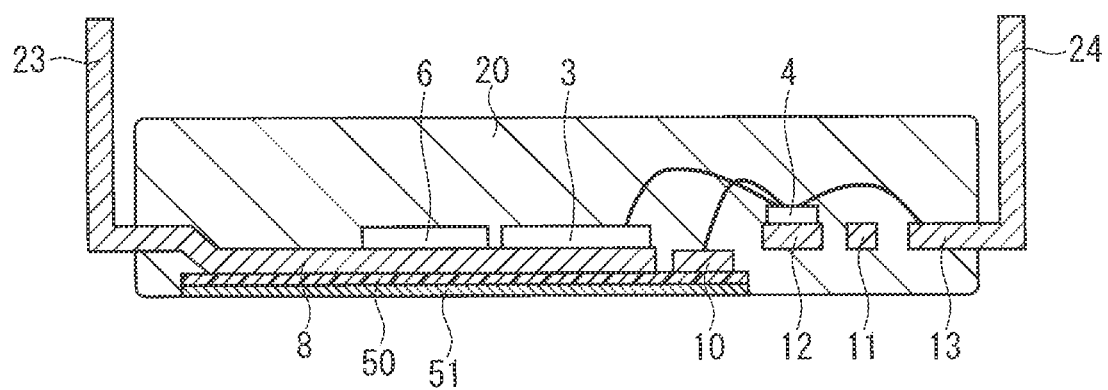
FIG. 5 is a cross-sectional view of a semiconductor device according to a second preferred embodiment.

The following describes a semiconductor device 1A according to a second preferred embodiment. FIG. 5 is a cross-sectional view of the semiconductor device 1A according to the second preferred embodiment. In the second preferred embodiment, FIG. 5 corresponds to FIG. 2. In the second preferred embodiment, the same components as those described in the first preferred embodiment will be denoted by the same symbols. The description of the same components will be thus omitted.

As illustrated in FIG. 5, the semiconductor device 1A further includes an insulator 50 disposed on the lower surfaces of the lead frame 7 and lead frame 8, and a metal plate 51 disposed on the lower surface of the insulator 50. The insulator 50 is preferably made of a ceramic-filler-containing resin. The metal plate 51 is preferably made of a metal that has a high radiation capability, such as aluminum or copper.

As described above, the semiconductor device 1A according to the second preferred embodiment further includes: the lead frame 7 on which the IGBT 2 is mounted, where the lead frame 7 includes the P-terminals 21; the lead frame 8 on which the IGBT 3 is mounted, where the lead frame 8 includes the power output terminal 23; the insulator 50 disposed on the lower surfaces of the lead frame 7 and lead frame 8; and the metal plate 51 disposed on the lower surface of the insulator 50. Hence, such a configuration enhances heat conduction from the IGBT 2 and IGBT 3 to a heat-radiation surface and thus provides a uniform thickness of a heat-radiation path, when compared with the configuration of the first preferred embodiment.

Third Preferred Embodiment

Figure 6:
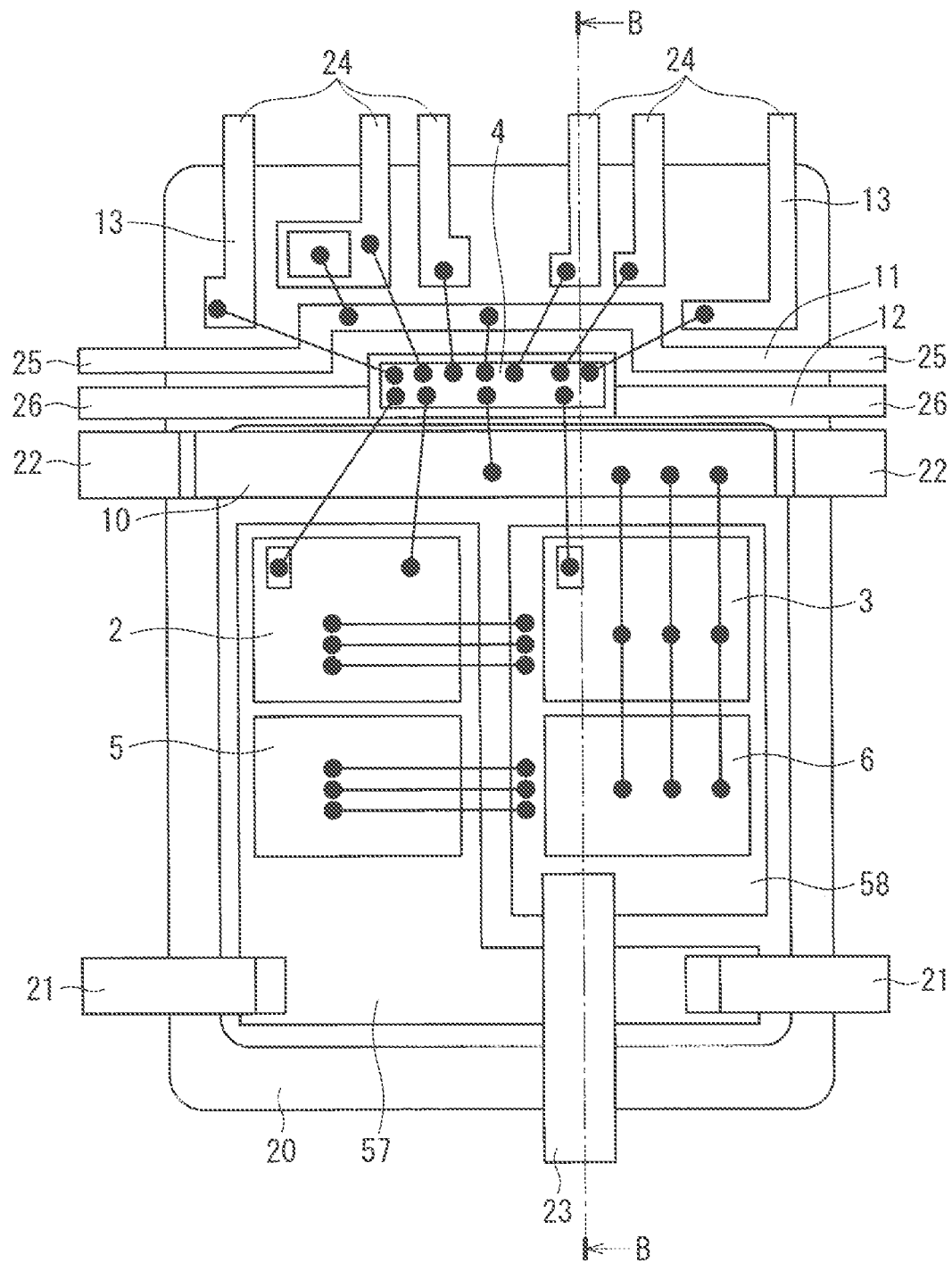
FIG. 6 is a perspective plan view of a semiconductor device according to a third preferred embodiment.
Figure 7:
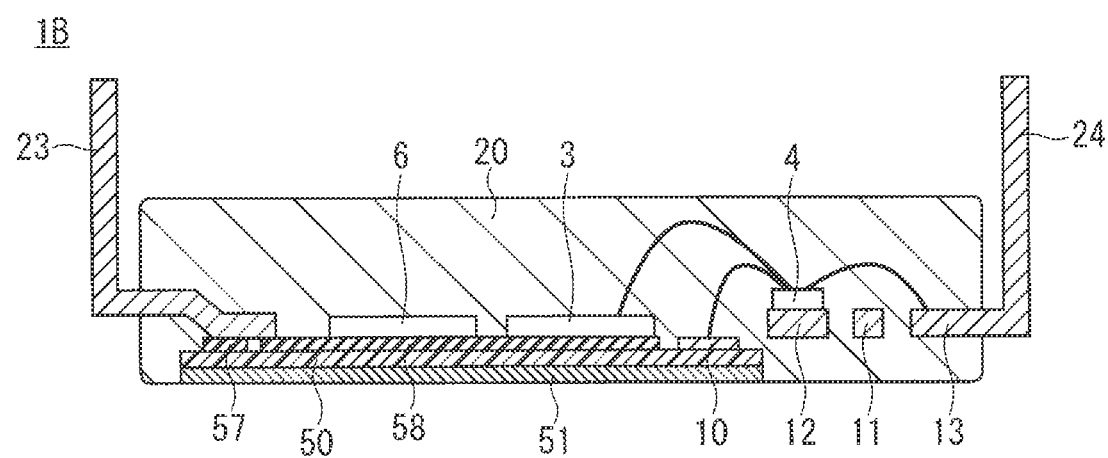
FIG. 7 is a cross-sectional view taken along line B-B in FIG. 6.

The following describes a semiconductor device 1B according to a third preferred embodiment. FIG. 6, is a perspective plan view of the semiconductor device 1B according to the third preferred embodiment. FIG. 7 is a cross-sectional view taken along line B-B in FIG. 6. In the third preferred embodiment, the same components as those described in the first and second preferred embodiments will be denoted by the same symbols. The description of the same components will be thus omitted.

As illustrated in FIGS. 6 and 7, the semiconductor device 1B according to the third preferred embodiment includes a substrate 57 on which the IGBT 2 is mounted and a substrate 58 on which the IGBT 3 is mounted, in place of the lead frame 7 and the lead frame 8. The substrate 57 is a first insulating substrate. The substrate 58 is a second insulating substrate. Metal wire patterns (corresponding to metal patterns) are formed in portions on which the IGBT 2 and IGBT 3 are mounted through for instance, an etching process, on an insulating material such as ceramic. This completes the substrate 57 and the substrate 58.

FIGS. 6 and 7 illustrates that the IGBT 2 and the FWD 5 are mounted on the substrate 57; and the IGBT 3 and the FWD 6, on the substrate 58. The control circuit 4 may be also mounted on the substrate 57 or the substrate 58.

As described above, the semiconductor device 1B according to the third preferred embodiment includes the substrate 57, on which the IGBT 2 is mounted, and the substrate 58, on which the IGBT 3 is mounted. The substrate 57 has the metal wire pattern in the portion, on which the IGBT 2 is mounted, and the substrate 57 is the first insulating substrate. The substrate 58 has the metal wire pattern in the portion, on which the IGBT 3 is mounted, and the substrate 58 is the second insulating substrate. The second preferred embodiment describes that the insulator 50 is made of resin so that the lead frame 7 and the lead frame 8 are well bonded together. In contrast, the third preferred embodiment describes that the substrate 57 and the substrate 58 are made by forming the metal wire patterns on the insulating material such as ceramic. Hence, the substrate 57 and the substrate 58 have a more improved heat-radiation capability than the insulator 50. Consequently, the third preferred embodiment achieves a more improved heat-radiation capability than the second preferred embodiment.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device with a half-bridge configuration, comprising:
   a plurality of P-terminals, each of which is connected to a high-side end of a half bridge;
   a plurality of N-terminals, each of which is connected to a low-side end of said half bridge;
   a power output terminal connected to a connection point between a high-side switching element of said half bridge and a low-side switching element of said half bridge;
   a plurality of power supply terminals and a plurality of ground (GND) terminals, each of the plurality of power supply terminals and the plurality of GND terminals is connected to a control circuit configured to control said high-side switching element and said low-side switching element;
   at least one control terminal through which said control circuit is configured to control said high-side switching element and said low-side switching element; and
   a package that is rectangular in a plan view and accommodates said high-side switching element, said low-side switching element, and said control circuit, wherein
   said at least one control terminal is disposed on a first side of said package, opposite to a second side on which said power output terminal is disposed,
   each of at least one P-terminal of said plurality of P-terminals, at least one N-terminal of said plurality of N-terminals, at least one power supply terminal of said plurality of power supply terminals, and at least one GND terminal of said plurality of GND terminals is disposed on a third side of said package,
   each of at least another P-terminal of said plurality of P-terminals, at least another N-terminal of said plurality of N-terminals, at least another power supply terminal of said plurality of power supply terminals, and at least another GND terminal of said plurality of GND terminals is disposed on a fourth side of said package, and
   both of the third side and the fourth side are orthogonal to said second side.

2. The semiconductor device according to claim 1, further comprising:
   a first lead frame on which said high-side switching element is mounted, said first lead frame including said at least one P-terminal;
   a second lead frame on which said low-side switching element is mounted, said second lead frame including said power output terminal;
   an insulator disposed on a lower surface of said first lead frame and a lower surface of said second lead frame; and
   a metal plate disposed on a lower surface of said insulator.

3. The semiconductor device according to claim 1, further comprising:
   a first insulating substrate on which said high-side switching element is mounted, said first insulating substrate having a metal pattern in a portion on which said high-side switching element is mounted; and
   a second insulating substrate on which said low-side switching element is mounted, said second insulating substrate having a metal pattern in a portion on which said low-side switching element is mounted.

4. A semiconductor device with a half-bridge configuration, comprising:
   at least one P-terminal connected to a high-side end of a half bridge;
   a plurality of N-terminals, each of which is connected to a low-side end of said half bridge;
   a power output terminal connected to a connection point between a high-side switching element of said half bridge and a low-side switching element of said half bridge;
   at least one power supply terminal and at least one ground (GND) terminal each connected to a control circuit configured to control said high-side switching element and said low-side switching element;
   at least one control terminal through which said control circuit is configured to control said high-side switching element and said low-side switching element; and
   a package that is rectangular in a plan view and accommodates said high-side switching element, said low-side switching element, and said control circuit, wherein
   said at least one control terminal is disposed on a first side of said package, opposite to a second side on which said power output terminal is disposed,
   said at least one P-terminal, said at least one N-terminal, said at least one power supply terminal, and said at least one GND terminal are disposed on a third side of said package, orthogonal to said second side, and
   said control circuit is connected to said plurality of N-terminals through an internal wire that connects said control circuit with a central portion of a lead frame disposed between said plurality of N-terminals, said control circuit being positioned inside said package and adjacent to said control circuit, and configured to detect an overcurrent of said high-side switching element and an overcurrent of said low-side switching element in response to an input from said at least one N-terminal, to protect against a short circuit.

* * * * *